United States Patent [19]

Mikkola et al.

[11] Patent Number: 5,731,772
[45] Date of Patent: Mar. 24, 1998

[54] METHOD AND APPARATUS FOR COMPENSATION FOR A DC VOLTAGE OFFSET OF A DIGITAL TO ANALOG CONVERTER

[75] Inventors: Pekka Mikkola, Salo; Markku Lintinen, Tampere; Jukka Ranta, Salo, all of Finland

[73] Assignee: Nokia Mobile Phones Ltd., Salo, Finland

[21] Appl. No.: 790,399

[22] Filed: Jan. 29, 1997

Related U.S. Application Data

[63] Continuation of Ser. No. 346,088, Nov. 29, 1994, abandoned.

[30] Foreign Application Priority Data

Nov. 30, 1993 [FI] Finland .................. 935346

[51] Int. Cl.⁶ .................................. H03M 1/10
[52] U.S. Cl. .................. 341/118; 341/119; 341/120; 341/121; 341/144
[58] Field of Search .................. 341/118, 119, 341/120, 121, 144

[56] References Cited

U.S. PATENT DOCUMENTS

| | | | |
|---|---|---|---|
| 4,468,651 | 8/1984 | Lechner et al. | 340/347 |
| 4,943,807 | 7/1990 | Early et al. | 341/120 |
| 5,061,925 | 10/1991 | Sooch et al. | 341/120 |
| 5,087,914 | 2/1992 | Sooch et al. | 341/120 |
| 5,248,970 | 9/1993 | Sooch et al. | 341/120 |
| 5,311,179 | 5/1994 | Vaisanen et al. | 341/118 |

FOREIGN PATENT DOCUMENTS

| | | | |
|---|---|---|---|
| 0 145 976 | 6/1985 | European Pat. Off. | |
| 0 605 883 | 7/1994 | European Pat. Off. | |
| 3201297 A1 | 8/1982 | Germany | 341/120 |
| 58-136134 | 8/1983 | Japan | 341/118 |
| 61-52030 | 3/1986 | Japan | 341/144 |
| 5-308286 | 11/1993 | Japan | 341/118 |
| 6-204870 | 7/1994 | Japan | 341/120 |
| 953721 | 1/1981 | U.S.S.R. | 341/118 |
| 1325694 | 7/1987 | U.S.S.R. | 341/120 |
| 2250148 | 5/1992 | United Kingdom | 341/118 |
| WO 84/01245 | 3/1984 | WIPO. | |

OTHER PUBLICATIONS

English Translation of Official Action dated 8 Aug. 1994 on priority Finnish Application No. 935346 filed 30 Nov. 1993.

"Error Correction Techniques for High-Performance Differential A/D Converters" IEEE Journal of Solid-State Circuits, Dec. 1990, USA vol. 25, pp. 1318–1327.

IBM Technical Disclosure Bulletin vol. 16 No. 1, Jun. 1993.

*Primary Examiner*—Fritz Fleming
*Assistant Examiner*—Jason H. Vick
*Attorney, Agent, or Firm*—Perman & Green, LLP

[57] ABSTRACT

Disclosed is a method and a device for compensating the DC offset (dU) of a D/A converter (2), particularly in the base frequency modulator of a mobile phone. The method and the device use an error correction register (5), whose value is changed on the basis of the DC offset, and which is added to each signal sample to be converted for compensating the DC offset. The value of the error correction register (5) is changed in a testing mode so that a preset control value is fed into the D/A converter (2), corresponding to the zero voltage of the output of an ideal D/A converter; the voltage values of outputs of a differential output pair (2a, 2b) arranged in connection with the D/A converter (2) are compared to verify the polarity of the voltage difference (dU) of the outputs and the polarity, i.e. the sign, of a relative DC offset; and, on the basis of the polarity of the voltage difference (dU), the value of the error correction register (5) is either decreased or increased by one from the preset initial value which is preferably zero.

20 Claims, 1 Drawing Sheet

METHOD AND APPARATUS FOR COMPENSATION FOR A DC VOLTAGE OFFSET OF A DIGITAL TO ANALOG CONVERTER

FIELD OF INVENTION

This is a continuation of application Ser. No. 08/346,088 filed on Nov. 29, 1994 now abandoned.

The present invention relates to a method and apparatus for compensating the DC offset voltage of a D/A converter, in particular for a D/A Converter for a digital radio telephone.

BACKGROUND TO INVENTION

In digital radio telephones the modulation of a signal to be transmitted is carried out in the digital part of the modulator, after which the modulated digital signal is converted into an analog signal by a D/A converter. The analogue signal is then coupled to the radio frequency section of the radio telephone for transmission as a radio signal. A problem with D/A converters is that a low and generally slowly varying DC offset occurs in their output, generally resulting from the non-ideal characteristics of the manufactured circuit components, and which is not related to the digital signal to be converted. The DC offset causes undesirable carrier leakage in the transmission signal of the mobile phone which interferes with the transmission of the signal. It is thus desirable that the DC offset of the D/A converter be compensated.

In a known method for compensating the DC offset of a D/A converter an error correction register is arranged in connection with the D/A converter, the value of the contents of the error correction register being modified in accordance with the measured DC offset and added to each signal to be converted. By obtaining a value for the error correction register which is opposite in polarity but the same magnitude as the DC offset of the D/A converter, the DC offset can be compensated.

A problem with the above-described method for compensating the DC offset is that it does not take into account the variation in DC offset due to temperature changes. This temperature behaviour is neither predictable nor necessarily regular, and in addition, it is different for respective D/A converter component units. Since it is not economically feasible to measure the temperature behaviour of each D/A converter component and to tabulate it in a memory arranged in connection with the D/A converter, the compensation of the DC offset due to temperature has to be carried out in some other way that is economic.

SUMMARY OF THE INVENTION

In a first aspect the present invention provides a method for compensating for an offset in a signal of an electronic device, comprising the steps of:

- inputting a predetermined signal to the electronic device;
- deriving an error signal indicative of a difference between an ideal output and an actual output from the electronic device each corresponding to the predetermined signal;
- modifying a compensation value stored in a memory means in accordance with the error signal; and
- adding said value to a subsequent signal input to the electronic device.

In a second aspect the present invention provides apparatus for compensating for an offset in a signal of an electronic device comprising

- input means for inputting a predetermined signal to the electronic device;
- detecting means for detecting a difference between an ideal output and an actual output from the electronic device each corresponding to the predetermined signal;
- modifying means for modifying a compensation value stored in a memory means in accordance with the detected difference; and
- adding means for adding said value to a subsequent signal input to the electronic device.

This has the advantage in that offsets can be compensated for even if they vary, without having to have complex look up tables. The invention enables the updating of compensation values during operation of equipment in which the apparatus is disposed, and take into account thermal drift or other such reasons for non ideal behaviour of thee electronic device.

In a preferred embodiment, the method can be repeated until the difference passes through a minimum value. This advantageously provides an initialization of the compensation value during, for example, start up of equipment utilizing the invention.

Preferably, the method and the apparatus are arranged such that the predetermined signal is input to the electronic device only when the device is not being used for its normal purpose. This means that updating or modification of the compensation value can be performed without interrupting the normal operation of the electronic device.

DETAILED DESCRIPTION OF EMBODIMENTS OF THE INVENTION

Figure 1:
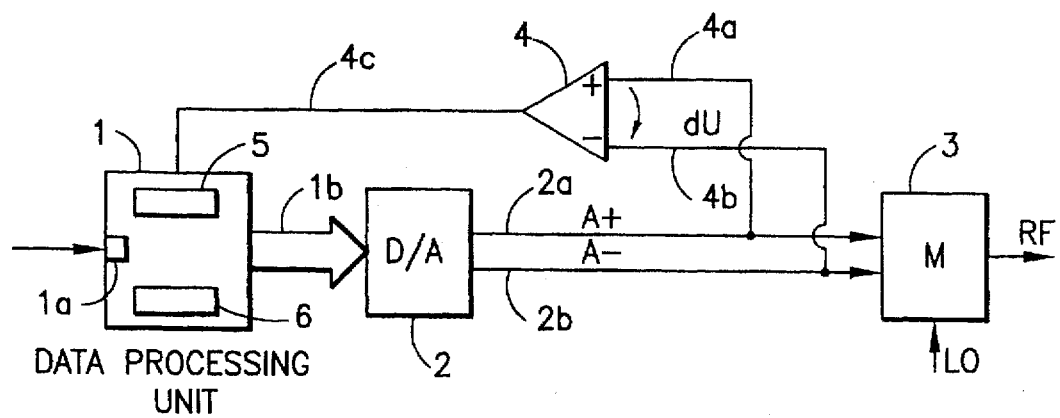
FIG. 1 shows a block diagram of a circuit arrangement for compensating the DC offset of a D/A converter.

The circuit arrangement in FIG. 1 comprises data processing unit 1, D/A converter 2, RF modulator 3, and comparator 4. Data processing unit 1 is preferably a microprocessor-based circuit component comprising error correction register 5 and testing unit 6. Error correction register 5 can optionally be disposed outside of data processing unit 1 and in connection with the D/A converter. Data processing unit 1 and D/A converter 2 are linked together by data bus 1b. D/A converter 2 is a peripheral component of the microprocessor circuit which is generally implemented so that it comprises a number of registers for different purposes. D/A converter 2 is provided with at least one differential output pair 2a, 2b, output signals A+, A− obtained from the output pair being signals of opposite phases to one another but having equal values. Input terminals 4a, 4b of comparator 4 are connected to differential outputs 2a, 2b of D/A converter 2. Output 4c of comparator 4 is, in turn, connected to data processing unit 1, Outputs 2a, 2b of D/A converter 2 are also connected to RF modulator 3. Testing unit 6 is preferably implemented in a programmable way in connection with data processing unit 1.

In the circuit arrangement in FIG. 1 a digital signal, which is for example a serial-signal comprising 8-bit words, is fed into data processing unit 1 via input 1a. One or more modulation signals are formed in data processing unit 1, depending on the modulation method used, and these signals are fed via bus 1b into D/A converter 2 in parallel form.

Analogue signals A+, A− obtained from the differential output pair 2a, 2b of the D/A converter are fed into RF modulator 3. Signals A+, A− and local oscillator signals are combined in modulator 3 to form a high-frequency RF signal which is sent to the radio path.

The apparatus for compensating the DC offset of the D/A converter comprises differential output pair 2a, 2b arranged in connection with D/A converter 2, comparator 4, data processing unit 1, error correction register 5 and testing unit 6. The checking and compensation of the DC offset is carried out whenever there is no signal intended to be sent to the radio path by data processing unit 1 and D/A converter 2. This phase is hereinafter called the testing mode.

The compensation of the DC offset is implemented by apparatus in accordance with the invention as shown in FIG. 1 in the following way. Error correction register 5 contains a suitable initial value which is preferably zero. The modulator is switched on. The testing mode is started immediately after switching on, and a control value corresponding to a zero voltage from the output of an ideal D/A converter is fed from testing unit 6 of data processing unit 1 into D/A converter 2 via bus 1b. In this case, after a normal D/A conversion carried out by the D/A converter, each output 2a, 2b of the differential output pair should have a zero voltage, assuming that no DC offset occurs. Differential outputs 2a, 2b are independent of each other, whereby possible DC offsets in these outputs accordingly occur as independent voltage variations. If value UA+ of signal A+ present in output 2a is +0 mV and value UA− of signal A− present in output 2b is +10 mV, the voltage difference dU=(UA+)−(UA−)=−10 mV between inputs 4a, 4b of the comparator. The polarity of difference dU of the output voltages of outputs 2a, 2b of D/A converter 2, i.e., whether the difference is positive or negative, is determined by comparator 4. In this example, where a negative voltage difference, i.e., dU=−10 mV is observed in the input terminals 4a, 4b, as a result of the comparison carried out by comparator 4, a positive signal is placed on output 4c of the comparator, i.e., the output is raised to a positive constant voltage. Data processing unit 1 examines the state of output 4c of comparator 4, and if it is high, modifies the contents of error correction register 5 by subtracting one from it, whereby the value of error correction register 5 is −1 in this example.

The control value of testing unit 6, to which the value of the error correction register updated in connection with the testing phase has been added, is fed into D/A converter 2, and the testing phase begins again. Comparator 4 is again used to check the polarity of difference dU of the output voltages of outputs 2a, 2b of D/A converter 2, i.e., whether the difference is positive or negative, and if it is observed that offset voltage dU of signals A+, A− is still negative, the state of output 4c of comparator 4 is maintained up in the positive constant voltage. Data processing unit 1 is used to check the state of output 4c of comparator 4 and if it is high, the value of the contents of error correction register 5 is modified by subtracting one from it, whereby the value of error correction register 5 is −2 in this example.

The above-described testing phases are repeated in the testing mode until the polarity of difference dU of the output voltages of outputs 2a, 2b of D/A converter 2 is changed with respect to the previous testing phase. Consequently, it is observed in the above example that the sign of offset voltage dU of signals A+, A− is changed from negative to positive, whereby also the state of output 4c of comparator 4 is changed from the positive constant voltage to the negative constant voltage, i.e., the output is lowered. The change in state of output 4c of comparator 4 is observed by data processing unit 1 and thus it is known that voltage difference dU as well as the DC offset are as close to zero as possible in this configuration, resulting from the compensation of the value of error correction register 5. The testing mode is now brought to an end. Effectively initialization of the compensation of the DC offset has been carried out and the modulator is ready for normal operation.

The testing mode is preferably activated in the above-described manner as soon as the modulator or the device in which it is included, is switched on. It is also desirable to repeat the testing mode at intervals during normal operation, such as between the transmitting times of the actual signals to be transmitted. The testing mode and the compensation of the DC offset is implemented as a single testing phase corresponding to the above-described first testing phase carried out after switching on the modulator. Thus, a control value corresponding to the zero voltage of an ideal D/A converter is fed into D/A converter 2. Comparator 4 is used to verify the polarity of the difference dU between the output voltages of outputs 2a, 2b of D/A converter 2. If the difference is positive, output 4c of comparator 4 is lowered (or remains low) and the value of error correction register 5 is increased by one and, conversely, if the difference is negative, output 4c of comparator 4 is raised (or remains high) and the value of error correction register 5 is decreased by one. The testing mode is ended and the procedure is not continued even though the voltage state of output 4c of comparator 4 is not changed from high to low or vice versa. This testing mode is repeated at suitable, regular intervals such as at intervals of one second or one minute depending on the application and the conditions. The rate of change of the DC offset is considered to be sufficiently low with respect to the repetition of the testing mode and to the repetition interval of the updating of the error correction register, consequently it is not necessary to repeat the testing phases at any more frequent intervals.

Figure 2:
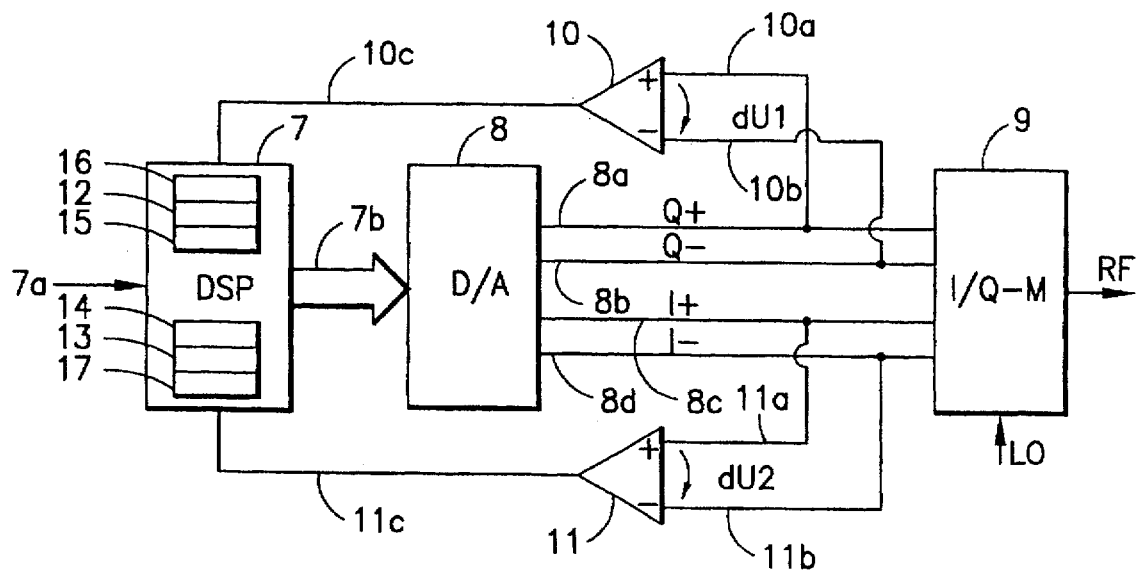
FIG. 2 shows a block diagram of the GMSK modulator of a mobile phone with the parts relating to the compensation of the DC offset of the D/A converter shown.

FIG. 2 shows a GMSK modulator for a mobile phone. This modulator includes signal processor 7 serving as a data processing unit, D/A converter 8 end I/Q base frequency modulator 9 which are all connected in series to one another in the foregoing order. A bit stream such as speech data packed in time division frames is fed into digital signal processor 7 through input connector 7a. Digital signal processor 7 forms the modulation signals for the I and Q branches, from the data fed into it, which are further fed through data bus 7b in parallel form to D/A converter 8. D/A converter 8 contains two pairs of differential outputs 8a, 8b and 8c, 8d. First output pair 8a, 8b gives a first pair of analogue differential output signals Q+, Q− of the Q branch, and second output pair 8c, 8d gives a second pair of analogue differential output signals I+, I− of the I branch. These differential output signals Q+, Q−, I+, I− are fed to I/Q modulator 9 where the signals are converted into high-frequency signals using local signal LO and after this they may be mixed up to a higher frequency into a suitable radio signal (not shown in the figure) and transmitted to the radio path. Testing unit 14 is preferably implemented as a programmable unit within or in connection with signal processor 7. Signal processor 7 is used to check outputs 10c, 11c of comparator 10, 11 and to update error correction registers 12, 13.

In outputs 8a, 8b and 8c, 8d of D/A converter 8 there occurs at least occasionally a DC offset which is mainly due to the voltage drift due to changes in temperature, as already discussed. The device includes, in order to compensate the DC offset of the D/A converter, two differential output pairs 8a, 8b and 8c, 8d arranged in connection with D/A converter 8 and, correspondingly, two comparators 10, 11 whose inputs 10a, 10b and 11a, 11b are connected to output pairs 8a, 8b; and 8c, 8d of D/A converter 8, digital signal processor 7 to which output 10c, 11c of the respective comparator 10, 11 is connected, two error correction registers 12, 13 and testing unit 14. Error correction registers 12, 13 and testing unit 14 are preferably in connection with digital signal processor 1.

Possible DC offsets of D/A converter 8 are compensated in the following manner: The DC offset of D/A converter 8 is measured when the converter is not used for modulating time division bursts transmitted by the mobile phone. Thus, in the testing mode a preset digital control value, corresponding to the zero voltage of the output of an ideal D/A converter, is fed in parallel form from testing unit 14 into D/A converter 8 via bus 7b. In this case a zero voltage should occur in differential output pairs 8a, 8b and 8c, 8d of D/A converter 8, via bus 7b i.e., all the outputs should be in the zero potential. Voltage values UQ+, UQ− of the outputs of first output pair 8a, 8b of D/A converter 8 are compared in first comparator 10 and, correspondingly, voltage values UI+, UI− of the outputs of second differential output pair 8c, 8d are compared in second comparator 11. If voltage difference dU1=(UQ+)−(UQ−) and/or dU2=(UI+)−(UI−) of the outputs of output pair 8a, 8b and/or 8c, 8d of the D/A converter is positive, output 10c and/or 11c of comparator 10 and/or 11 is lowered, i.e., it is brought to the negative constant voltage which is verified by digital signal processor 7 and the value of the contents of error correction register 12 and/or 13 is increased by one on the basis of this. If voltage difference dU1 and/or dU2 of the outputs of differential output pair 8a, 8b and/or 8c, 8d of the D/A converter is negative, output 10c and/or 11c of comparator 10 and/or 11 is increased, i.e., it is brought to the positive constant voltage which is verified by digital signal processor 8 and the value of the contents of corresponding error correction registers 12 and/or 13 is decreased by one on the basis of this. Thus the value of each error correction register 12 and/or 13 depends on the DC offsets and in particular on the sign of the differences thereof occurring in output pair 8a, 8b and/or 8c, 8d of the D/A converter.

The above-described testing phase is then repeated. The control value of testing unit 14, in which the value of error correction register 12 and/or 13 updated in connection with the previous testing phase is added, is fed into D/A converter 8. Comparators 10 and/or 11 are again used to verify the polarity of differences dU1 and/or dU2 of the output voltages of outputs 8a, 8b and/or 8c, 8d of D/A converter 8, i.e., whether the difference is positive or negative, and if observed that one or both of differences dU1 and/or dU2 of the output voltages are still positive, the state of outputs 10c and/or 11c of the corresponding or both comparators 10 and/or 11 is kept low in the negative constant voltage. Signal processor 7 is used to examine the states of outputs 10c and/or 11c of comparators 10 and/or 11, i.e., the state of one or both outputs is low, which results in changing the value of the contents of the corresponding or both error correction registers 12 and/or 13 by increasing it by one.

The above-described testing phases are repeated in the testing mode until the polarity of difference dU1 and/or dU2 of the output voltages of output pairs 8a, 8b and/or 8c, 8d of D/A converter 8 changes. In this case it is observed according to the above example that the sign of offset voltage dU1 and/or dU2 of signals UQ+, UQ− and/or UI+, UI− is changed from positive to negative, whereby also the state of output 10c and/or 11c of comparator 10 and/or 11 is changed from a negative signal to a positive signal, i.e., the output is increased and it is in the positive constant voltage. Any change in state of outputs 10c, 11c of both comparators 10, 11 is verified separately by signal processor 7 and, consequently, it is known that offset voltages dU1, dU2 as well as the DC offsets are as close to the zero voltage as possible, due to carrying out the compensations of the values of the corresponding error correction registers 12 and/or 13 in question. The testing mode is brought to an end. The modulator is ready for normal operation. After this the values of error correction register 12 and 13 are added in each signal sample to be converted, and correspondingly in the output signal of the Q and I branches for compensating the DC offset.

Signal processor 7 or a corresponding data processing unit preferably includes equipment such as logic unit 16, 17 for monitoring the voltage states of outputs 10c, 11c of each comparator 10, 11 and especially for monitoring a change thereof during the testing mode between two sequential testing phases. The testing mode is ended on the basis of the information provided by logic units 16, 17 when the voltage state of the output of the comparator is changed from positive to negative or vice versa. In this case the value of error correction register 12, 13 is kept unmodified.

The testing mode is implemented in the above-described manner in several testing phases and the contents of error correction registers 12, 13 is checked several times in a row as soon as the mobile phone or a corresponding device is switched on. It is desirable to update the contents of error correction registers 12, 13 during the normal use of the mobile phone at suitable intervals such as when D/A converter 8 is free from processing the actual signals to be modulated. In this case the updating of error correction registers 12, 13 can be implemented in only a few or even one testing mode phase, in which a control value corresponding to the zero voltage is written from testing unit 14 to D/A converter 8, and if difference dU1 and/or dU2 of the voltages of output pair 8a, 8b and/or 8c, 8d is positive, the value of error correction register 12 and/or 13 is decreased by one and if difference dU1 and/or dU2 of the voltages is negative, the value of error correction register 12 and/or 13 is increased by one, as previously described. After this the testing mode is ended and no attention is paid to the change in state of outputs 10c, 11c of comparators 10, 11. The same procedure is implemented also in connection with the compensation of the DC offset and the modulator in FIG. 1. Due to the slow rate of change of the DC offset it is possible that only one testing phase need be carried out at each interval.

Taking into account the testing mode implemented in connection with normal use of a mobile phone or a corresponding device, it is preferable to further include in the device for compensating the DC offset of the D/A converter equipment 15 (FIG. 2) for detecting time division bursts and/or for locating free time slots, whereby the contents of error correction registers 12, 13 can be updated during the testing mode. Equipment 15 can be placed in connection with digital signal processor 7 and implemented as a unit with programs, utilizing the existing structures.

The data processing unit is used to process the digital signals fed into the modulator, to monitor the testing mode and the testing unit in particular, to examine the state of one or more comparators, and to place the value of the contents of one or more error correction registers. The data processing unit can be implemented, as already stated before, as a microcomputer-based device such as a digital signal processor or a logic circuit of a combination thereof.

In view of the foregoing description it will be evident to a person skilled in the art that various modifications may be made within the scope of the invention. In particular, the present invention may apply to any type of circuit or application in which a DC offset needs compensating.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

What we claim is:

1. A method for compensating for an offset in a signal of an electronic device, comprising the steps of:

inputting a predetermined signal to the electronic device, the predetermined signal being selected so as to elicit a first output signal from an output port of said electronic device, the first output signal ideally being equal to a predetermined output signal having a zero offset voltage component;

deriving an error signal having a polarity that is indicative of a difference between the first output signal and the predetermined output signal from the electronic device;

modifying a compensation value stored in a memory means in accordance with the error signal; and adding said compensation value to a subsequent signal input to the electronic device so as to cause a subsequent output signal from the electronic device to approach the predetermined output signal.

2. A method according to claim 1, further comprising repeating said steps with the subsequent signal being the predetermined signal until said difference passes through a minimum value.

3. A method according to claim 1 wherein the electronic device is a D/A converter.

4. A method according to claim 1, wherein the electronic device has a differential pair output port and the first output signal is a differential signal.

5. A method according to claim 4, wherein the error signal is indicative of the difference between respective signals of the differential signal.

6. A method according to claim 1, wherein the predetermined signal has substantially zero magnitude.

7. A method according to claim 1, wherein the value stored in the memory means is incremented if the polarity is negative and decremented if the polarity is positive.

8. A method according to claim 1, wherein the passing of the difference through a minimum value is indicated by a change in the polarity of the difference.

9. A method according to claim 1, wherein said steps are performed during periods of non-use of the electronic device.

10. Apparatus for compensating for an offset in a signal of an electronic device comprising:

input means for inputting a predetermined signal to the electronic device, the predetermined signal being selected so as to elicit a first output signal from an output port of said electronic device, the first output signal ideally being equal to a predetermined output signal having a zero offset voltage component;

detecting means for detecting a polarity of a difference between the first output signal and the predetermined output signal;

modifying means for modifying a compensation value stored in a memory means in accordance with the detected polarity; and adding means for adding said compensation value to a subsequent signal input to the electronic device so as to cause a subsequent output signal from the electronic device to approach the predetermined output signal.

11. Apparatus according to claim 10, wherein the electronic device is a D/A converter.

12. Apparatus according to claim 10, wherein the electronic device has a differential pair output port for outputting the first output signal as a differential signal.

13. Apparatus according to claim 12, wherein the detecting means is adapted to detect the difference between respective signals of the differential signal.

14. Apparatus according to claim 10, wherein the input means is adapted to input a predetermined signal of substantially zero magnitude to the electronic device.

15. Apparatus according to claim 10, wherein the compensation value stored in the memory means is incremented if the said polarity is negative and decremented if the said polarity is positive.

16. Apparatus according to claim 10, wherein the passing of the difference through a minimum value is indicated by a change in the polarity of the difference.

17. Apparatus according to claim 10, wherein the input means inputs a predetermined signal to the electronic device when said electronic device is not in use.

18. Apparatus according to claim 17, and further comprising equipment for detecting free time slots or non use of the electronic device for identifying a time when the value stored in the memory means can be updated.

19. Circuitry for use in a radio telephone of a type that includes a digital to analog (D/A) converter for generating a DC signal as an input to an RF circuit, comprising:

a data processor having a digital output port coupled to a digital input port of said D/A converter, said D/A converter having at least one differential analog output port comprised of a first output line and a second output line;

a memory bidirectionally coupled to said data processor, said memory storing a D/A converter calibration value that is periodically determined by said data processor during a calibration routine that is executed by said data processor during a period of non-use of said RF circuit, said calibration value being retrieved from said memory and combined by said data processor with a digital signal applied to said digital input port of said D/A converter during a period of use of said RF circuit, said calibration value being determined by said data processor so as to cause said analog output port of said D/A converter to output a signal that is substantially free of an undesirable offset component; and a voltage comparator having a first input coupled to said first output line, a second input coupled to said second output line, and an output coupled to an input of said data processor, said data processor being responsive to a polarity of a signal output from said voltage comparator in response to an application of a calibration signal to said D/A converter, when executing said calibration routine, for modifying said calibration value until said calibration value, when combined with the calibration signal output from said data processor to said D/A converter, causes a change in polarity in said signal output from said voltage comparator.

20. Circuitry as set forth in claim 19, wherein said calibration signal has a value selected to cause, ideally, a zero volt signal to be output from said D/A converter.

* * * * *